United States Patent
Zhang

(10) Patent No.: US 8,558,579 B2
(45) Date of Patent: Oct. 15, 2013

(54) DIGITAL GLITCH FILTER

(75) Inventor: Jinglin Zhang, Suzhou (CN)

(73) Assignee: Freescale Semiconductor, Inc., Austin, TX (US)

( * ) Notice: Subject to any disclaimer, the term of this patent is extended or adjusted under 35 U.S.C. 154(b) by 1 day.

(21) Appl. No.: 13/540,634

(22) Filed: Jul. 3, 2012

(65) Prior Publication Data

US 2013/0038359 A1 Feb. 14, 2013

(30) Foreign Application Priority Data

Aug. 12, 2011 (CN) .......................... 2011 1 0230237

(51) Int. Cl.
*G01R 29/02* (2006.01)
*H03K 9/08* (2006.01)
(52) U.S. Cl.
USPC .................................. 327/31; 327/33; 327/34
(58) Field of Classification Search
None
See application file for complete search history.

(56) References Cited

U.S. PATENT DOCUMENTS

| | | | |
|---|---|---|---|
| 4,353,032 A * | 10/1982 | Taylor | 327/20 |
| 4,775,840 A * | 10/1988 | Ohmori et al. | 327/34 |
| 4,786,823 A * | 11/1988 | Abe et al. | 327/34 |
| 5,001,374 A | 3/1991 | Chang | |
| 6,535,057 B2 | 3/2003 | Chakravarthy | |
| 6,778,111 B1 | 8/2004 | Zhu | |
| 6,975,406 B2 | 12/2005 | Demarest | |
| 7,519,135 B2 | 4/2009 | Staszewski | |
| 7,579,894 B2 * | 8/2009 | Kejriwal | 327/386 |
| 7,719,320 B2 | 5/2010 | Cusmano | |
| 7,724,025 B2 | 5/2010 | Masleid | |
| 7,973,860 B2 * | 7/2011 | Hsieh et al. | 348/678 |

* cited by examiner

*Primary Examiner* — Tuan T Lam
(74) *Attorney, Agent, or Firm* — Charles Bergere

(57) ABSTRACT

A digital glitch filter for filtering glitches in an input signal includes first and second flip-flops and a synchronizer. The synchronizer includes third and fourth flip-flops. A glitch prone input signal is provided to the first and second flip-flops. Additionally, an input clock signal is provided to the first and second flip-flops and the synchronizer. A glitch occurring in the input signal toggles the first and second flip-flops between transmitting and non-transmitting states and first and second intermediate signals are generated. The synchronizer synchronizes the first and second intermediate signals with the input clock signal to generate a filtered output signal.

19 Claims, 3 Drawing Sheets

DIGITAL GLITCH FILTER

BACKGROUND OF THE INVENTION

The present invention relates to glitch filters, and, more particularly, to digital glitch filters for filtering glitches in signals.

A glitch is a sporadic and unintended switching of an input signal level to a high or a low state, followed by a return to the initial state. The transition lasts for a short duration. Glitches may be classified into positive and negative glitches. An abrupt rise in the signal level from the desired normal level is known as a positive glitch and an abrupt fall in the signal level from the desired normal level is known as a negative glitch. Glitches occur due to fault or design error in an electronic circuit. For example, an erroneously designed digital circuit may result in a race condition in the digital components of the digital circuit, leading to the occurrence of glitches. Additionally, the presence of external interfering signals may also lead to glitches. The occurrence of glitches in a digital circuit may lead to malfunctioning of the electronic circuit and cause the circuit to generate a spurious output.

Digital glitch filters are commonly used to eliminate glitches in a digital signal. In one such digital glitch filtering system, clocked circuits, such as a pair of D-type flip-flops connected as shift registers, are used for filtering glitches. A digital signal prone to glitches and an externally generated clock signal with a frequency that is an integral multiple of the frequency of the digital signal is provided to the above system. The digital signal is sampled using the clock signal and divided into multiple sub-intervals. The pair of D flip-flops compare the digital signal levels of two consecutive sub-intervals. If the signal levels are identical, then the current magnitude information is transmitted to the filtered output stage, otherwise the previous signal level is maintained at the output stage. This approach, however, has certain drawbacks. Firstly, the system requires a high frequency clock generator that increases the cost of the circuit. Secondly, the system may occasionally pass a glitch that is sampled at the rising edge of the clock signal, thus making the system unreliable. Thirdly, the system may ignore the glitches in a wide pulse since glitches may not have been sampled by the rising edge of the clock.

Therefore, it would be advantageous to have a glitch filter circuit that is simple, cost-effective, and robust enough to overcome the above mentioned drawbacks.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
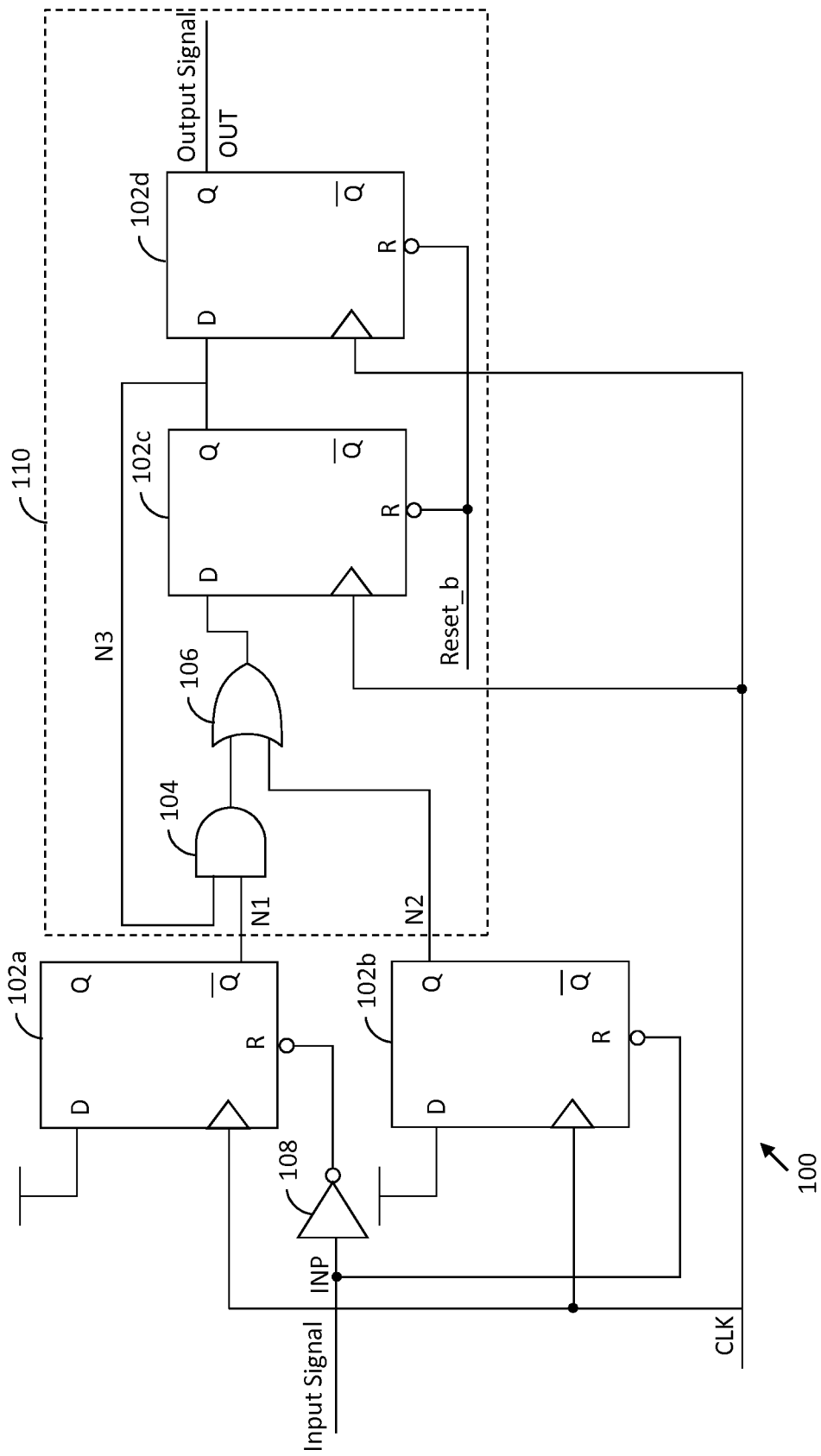
FIG. 1 illustrates a schematic diagram of a digital glitch filter in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a digital glitch filter for filtering glitches in an input signal is provided. The digital glitch filter includes a first flip-flop for generating a first intermediate signal, based on detection of a negative glitch in the input signal. The input signal is provided to either a set terminal or a reset terminal of the first flip-flop. The digital glitch filter further includes a second flip-flop for generating a second intermediate signal, based on detection of a positive glitch in the input signal. The inverted input signal is provided to either a set terminal or a reset terminal of the second flip-flop.

A synchronizer is connected to the first and second flip-flops for generating a filtered output signal, based on the first and second intermediate signals. The synchronizer includes an AND gate connected to either an output terminal or an inverted output terminal of the first flip-flop. An OR gate is connected to either an output terminal or an inverted output terminal of the second flip-flop and an output terminal of the AND gate. The synchronizer further includes third and fourth flip-flops. The third flip-flop has an input terminal connected to an output terminal of the OR gate and an output terminal connected to an input terminal of the AND gate and generates a third intermediate signal based on the first and second intermediate signals. The fourth flip-flop has a data input terminal connected to the output terminal of the third flip-flop and generates the filtered output signal based on the third intermediate signal.

In another embodiment of the present invention, a digital glitch filter for filtering glitches in an input signal is provided. The digital glitch filter includes a first latch for generating a first intermediate signal based on detection of a negative glitch in the input signal. The input signal is provided to either a set terminal or a reset terminal of the first latch. The digital glitch filter further includes a second latch for generating a second intermediate signal based on detection of a positive glitch in the input signal. An inverted input signal is provided to at least one of a set terminal and a reset terminal of the second latch.

A synchronizer connected to the first and second latches for generating a filtered output signal based on the first and second intermediate signals. The synchronizer includes an AND gate connected to an inverted output terminal of the first latch and an OR gate connected to an output terminal of the second latch and an output terminal of the AND gate. The synchronizer further includes first and second flip-flops. The first flip-flop has a data input terminal connected to an output terminal of the OR gate and an output terminal connected to an input terminal of the AND gate and generates a third intermediate signal, based on the first and second intermediate signals. The second flip-flop has a data input terminal connected to the output terminal of the first flip-flop and generates the filtered output signal based on the third intermediate signal.

Various embodiments of the present invention provide a digital glitch filter for filtering glitches in an input signal. The glitches cause the first and second flip-flops to toggle between transmitting and non-transmitting states. The toggling filters the glitches by preventing a short duration high input signal from being transmitted to the output stage of the digital glitch filter. When the input signal stays high for a duration that is more than one clock cycle of an input clock signal, the high input level is transmitted to the synchronizer. The synchronizer synchronizes the changed output level with the input clock signal to generate a filtered output signal. The digital glitch filter includes a maximum of four D-type flip-flops which results in a simple physical implementation of the digital glitch filter and reduces costs. Further, the width of the glitch to be filtered may be selected by adjusting the frequency of the input clock signal or by using a counter, thus providing the flexibility of filtering glitches with different widths.

Referring now to FIG. 1, a schematic diagram of a digital glitch filter 100 in accordance with an embodiment of the present invention is shown. The digital glitch filter 100 includes a plurality of flip-flops including a first flip-flop 102a, a second flip-flop 102b, a third flip-flop 102c, and a fourth flip-flop 102d, an AND gate 104, an OR gate 106, and a NOT gate 108. The AND gate 104, the OR gate 106, the third flip-flop 102c, and the fourth flip-flop 102d are collectively referred to as a synchronizer 110.

Input and inverted input signals are provided to the respective reset terminals of the first and second flip-flops 102a and 102b. In an embodiment of the present invention, the input signal is a digital signal that may include positive and/or negative glitches. An input clock signal is provided to the respective clock input terminals of the first flip-flop 102a, the second flip-flop 102b, the third flip-flop 102c, and the fourth flip-flop 102d. In an embodiment of the present invention, the first flip-flop 102a, the second flip-flop 102b, the third flip-flop 102c, and the fourth flip-flop 102d are D-type flip-flops. The data input terminals of the first and second flip-flops 102a and 102b are provided "logic 1" as an input. The first and second flip-flops 102a and 102b generate a first intermediate signal (N1) and a second intermediate signal (N2), respectively. The first and second intermediate signals are generated based on detection of a glitch in the input signal. Additionally, the first and second intermediate signals are generated based on the input clock signal. In an embodiment of the present invention, the input clock signal is generated externally by a crystal oscillator. The first and second intermediate signals are obtained at the inverted output and output terminals of the first and second flip-flops 102a and 102b, respectively.

In another embodiment of the present invention, the input signal and the inverted input signal are provided to the set terminals of the first and second flip-flops 102a and 102b, respectively. The first and second intermediate signals are obtained at the output and inverted output terminals of the first and second flip-flops 102a and 102b, respectively. Further, the data input terminals of the first and second flip-flops 102a and 102b are provided "logic 0" as an input.

The first and second intermediate signals are provided to the synchronizer 110. The synchronizer 110 includes the third and fourth flip-flops 102c and 102d, that are connected in series to form a shift register. The synchronizer 110 further includes the AND gate 104 and the OR gate 106. The output terminal of the AND gate 104 is connected to the input terminal of the OR gate 106 and the output terminal of the OR gate 106 is connected to the input terminal of the third flip-flop 102c. The synchronizer 110 synchronizes the first and second intermediate signals with the input clock signal to generate a filtered output signal. The first intermediate signal is provided to the AND gate 104.

In an embodiment of the present invention, when the first and second intermediate signals are obtained at the output and inverted output terminals of the first and second flip-flops 102a and 102b, respectively, the input terminal of the AND gate 104 is connected to the output terminal of the first flip-flop 102a. Further, the second intermediate signal is provided to the OR gate 106. The input terminal of the OR gate 106 is connected to the inverted output terminal of the second flip-flop 102b.

Further, the input clock signal is provided to the clock input terminal of the third flip-flop 102c. The third flip-flop 102c generates a third intermediate signal based on the output of the OR gate 106 and the input clock signal. The output terminal of the third flip-flop 102c is connected to the input terminal of the AND gate 104, to provide the third intermediate signal to the AND gate 104. Thereafter, the third intermediate signal is provided to the input terminal of the fourth flip-flop 102d. The fourth flip-flop 102d generates the filtered output signal based on the third intermediate signal and the input clock signal.

Figure 2:
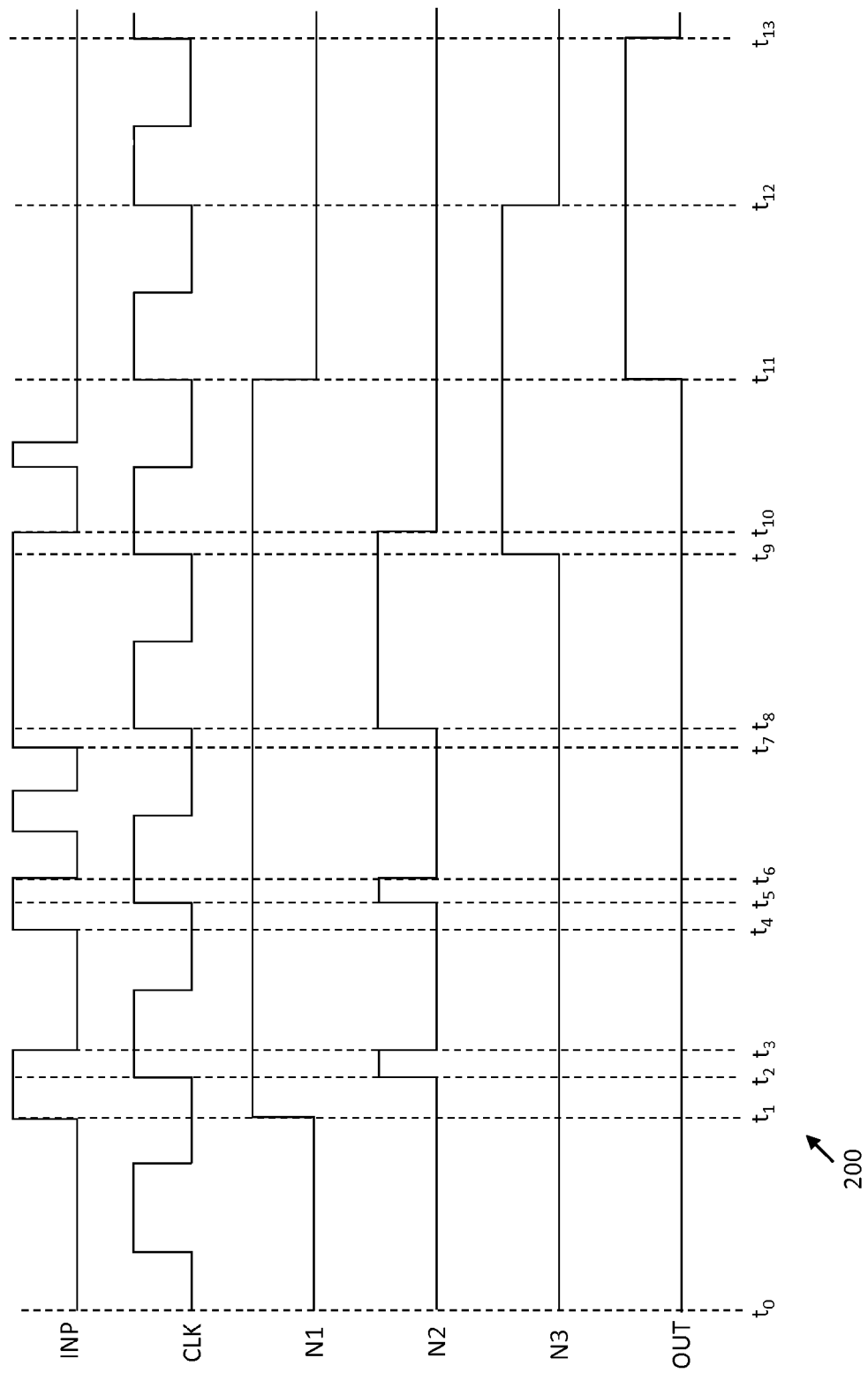
FIG. 2 illustrates a timing diagram for the circuit of FIGS. 1.

Referring now to FIG. 2, a timing diagram 200 corresponding to FIG. 1, in accordance with an embodiment of the present invention is shown. The timing diagram 200 includes waveforms corresponding to the input signal (INP), the input clock signal (CLK), the first intermediate signal (N1), the second intermediate signal (N2), the third intermediate signal (N3), and the filtered output signal (OUT). The functioning of the digital glitch filter 100 has been explained in conjunction with the timing diagram 200 in detail.

At time $t_1$, the input signal switches to a high state. This results in the first intermediate signal switching to a high state. It will be understood by a person skilled in the art that the switching of the input signal to a high state causes the first flip-flop 102a to enter a 'non-released state' in which the input at the input terminal of the first flip-flop 102a does not shift to the output terminal. Since an inverted input signal is provided to the reset terminal of the second flip-flop 102b, the second flip-flop 102b switches to a 'released state' in which the second flip-flop 102b is able to transmit the data at the input terminal to the output terminal. Additionally, "logic 1" is provided to the input terminals of the first and second flip-flops 102a and 102b throughout the operation of the digital glitch filter 100. At time $t_2$, a rising edge is obtained in input clock signal that results in the second intermediate signal switching to a high state. This in turn causes the output terminal of the OR gate 106 to switch to a high state, and the input terminal of the third flip-flop 102c to switch to a high state.

At time $t_3$, the input signal and the second intermediate signal switches to low state. Since the input signal stays high for less than a clock cycle of the input clock signal, the high input at the input terminal of the third flip-flop 102c (refer to FIG. 1) is not transmitted to the output terminal. As a result, the states of third intermediate and filtered output signals remain unchanged and the positive glitch is filtered successfully. In an embodiment of the present invention, the digital glitch filter 100 may be programmed to eliminate glitches that have a duration less than a predetermined number of cycles of the input clock signal. This may be achieved by adjusting the input clock frequency or by using a counter.

At time $t_4$, the input signal switches to a high state. At time $t_5$, a rising clock edge is obtained in input clock signal that causes the second intermediate signal and the input terminal of the third flip-flop 102c to switch to a high state. At time $t_6$, the input signal and the second intermediate signal switch to a low state. Since the input signal stays high for less than a clock cycle of the input clock signal, the high input at the input terminal of the third flip-flop 102c (refer to FIG. 1) is not transmitted to the output terminal. As a result, the states of third intermediate and filtered output signals remain unchanged and the positive glitch is filtered successfully.

At time $t_7$, the input signal switches to a high state. At time $t_8$, a rising edge is obtained in the input clock signal that causes the second intermediate signal and the input at the input terminal of the third flip-flop 102c to switch to a high state. At time $t_9$, a rising edge is obtained in the input clock signal that allows the third flip-flop 102c to transmit the high input at the input terminal to the output terminal. Thus, the third intermediate signal switches to a high state. Since the input signal stays high for more than one clock cycle, the high input at the input terminal of the third flip-flop 102c is transmitted to the output terminal and the high state of the input signal is transferred to the third intermediate signal. This also results in the input at the input terminal of the fourth flip-flop 102d to switch to a high state.

At time $t_{10}$), the input signal switches to a low state and subsequently, the second intermediate signal switches to a low state. This further leads to the input at the input terminal of the third flip-flop 102c to switch to a low state. At time $t_{11}$, a rising edge is obtained in the input clock signal that causes the fourth flip-flop 102d to transmit the high input at the input terminal to the output terminal, thereby resulting in the filtered output signal switching to a high state. Additionally, the first intermediate signal switches to a low state. At time $t_{12}$, a rising edge is obtained in the input clock signal and causes the third intermediate signal to switch to a low state which in turn causes the input at the input terminal of the fourth flip-flop 102d to switch to a low state. At time $t_{13}$, a rising edge is obtained in the input clock signal that causes the fourth flip-flop 102d to transmit the low input at the input terminal to the output terminal. Thus, the filtered output signal switches to a low state.

It should be understood by a person skilled in the art that the present invention eliminates glitches by tracking the duration of a high/low state of the input signal. A high state of the second intermediate signal sampled at a rising edge of the input clock signal (at time $t_9$) implies that the duration of the high state is greater than the duration of two successively occurring rising edges of the input clock signal. Therefore, the high state is transmitted to the output (at time $t_{11}$). A low state of the first intermediate signal sampled at a rising edge of the input clock signal (at time $t_{12}$) implies that the duration of the low state is greater than the duration of two successively occurring rising edges of the input clock signal. Therefore, the low state is transmitted to the output (at time $t_{13}$). Thus, the high state of the input signal from $t_7$ -$t_{10}$) can pass to the output, and the low state of the input signal from $t_{11}$-$t_{13}$ can pass to the output. The remaining high/low states of the input signal are treated as positive/negative glitches and are filtered from the output.

In another embodiment of the present invention, the input signal and the inverted input signal are provided to the set terminals of the first and second flip-flops 102a and 102b, respectively. The first and second intermediate signals are obtained at the output and inverted output terminals of the first and second flip-flops 102a and 102b, respectively. Additionally, "logic 0" is provided to the input terminals of the first and second flip-flops 102a and 102b. The reset terminals of the third and fourth flip-flops 102c and 102d are provided with a "RESET_B" signal to maintain the flip-flops in a 'released state' in which case the input at the input terminals are transmitted to the output terminals at the rising edge of the input clock signal.

Various embodiments of the present invention have been explained above for removal of positive glitches in the input signal. It will be understood by a person skilled in the art that the negative glitches occurring in the input signal are eliminated similar to positive glitches. The duration of the high and low states of the input signal is tracked. A high/low state persisting for more than two successive clock rising edges is transmitted to the output. A high/low state persisting for less than two successive clock rising edges is not transmitted to the output and any positive/negative glitches in the input signal are successfully filtered.

Figure 3:
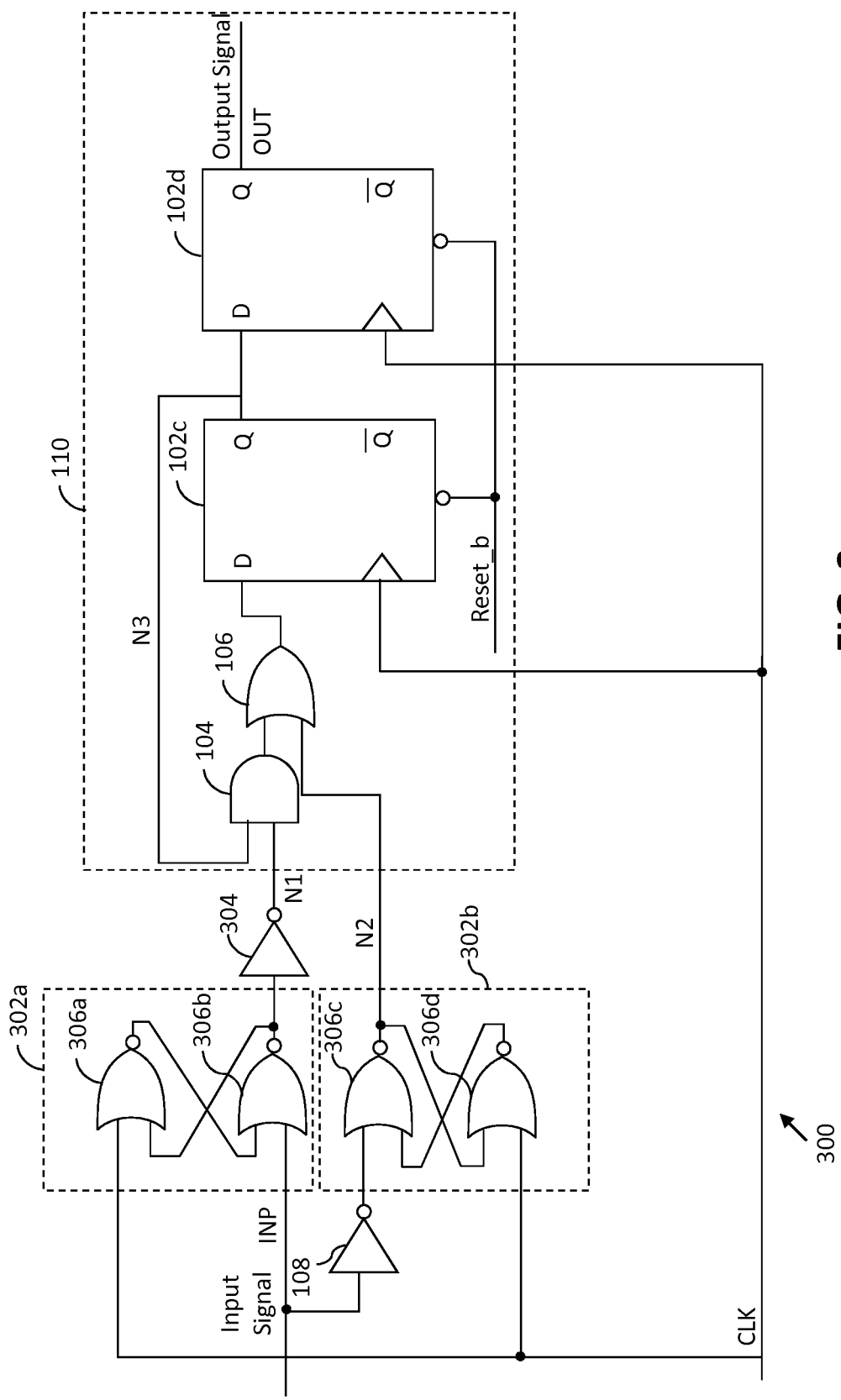
FIG. 3 illustrates a schematic diagram of a digital glitch filter in accordance with another embodiment of the present invention.

In various embodiments of the present invention, the first and second flip-flops 102a and 102b may be replaced by S-R latches, as illustrated in FIG. 3. FIG. 3 shows a schematic diagram of a digital glitch filter 300 in accordance with another embodiment of the present invention. The digital glitch filter 300 is similar to the digital glitch filter 100 described in FIG. 1, except that the first and second flip-flops 102a and 102b are replaced by first and second S-R latches 302a and 302b, respectively and additionally includes a NOT gate 304. The first S-R latch 302a includes first and second NOR gates 306a and 306b respectively. The second S-R latch 302b includes third and fourth NOR gates 306c and 306d respectively. The NOT gate 304 is connected between the output terminal of the second NOR gate 306b and the input terminal of the AND gate 104.

An input signal and an input clock signal are provided to the set and reset terminals of the first S-R latch 302a respectively. In an embodiment of the present invention, the input signal and the input clock signal are provided to the reset and set terminals of the first S-R latch 302a, respectively. Further, an inverted input signal and the input clock signal are provided to the set and reset terminals of the second S-R latch 302b, respectively. In another embodiment of the present invention, the inverted input signal and the input clock signal are provided to the reset and set terminals of the second S-R latch 302b, respectively.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A digital glitch filter for filtering an input signal, comprising:
   a first flip-flop for generating a first intermediate signal based on detection of a negative glitch in the input signal, wherein the input signal is provided to at least one of a set terminal and a reset terminal of the first flip-flop;
   a second flip-flop for generating a second intermediate signal based on detection of a positive glitch in the input signal, wherein an inverted input signal is provided to at least one of a set terminal and a reset terminal of the second flip-flop; and
   a synchronizer, connected to the first and second flip-flops, for generating a filtered output signal based on the first and second intermediate signals, wherein the synchronizer includes,
      a first logic gate connected to at least one of an output terminal and an inverted output terminal of the first flip-flop;
      a second logic gate connected to at least one of an output terminal and an inverted output terminal of the second flip-flop and an output terminal of the first logic gate;
      a third flip-flop, having an input terminal connected to an output terminal of the second logic gate and an output terminal connected to an input terminal of the first logic gate, for generating a third intermediate signal based on the first and second intermediate signals; and a fourth flip-flop, having a data input terminal connected to the output terminal of the third flip-flop, for generating the filtered output signal based on the third intermediate signal.

2. The digital glitch filter of claim 1, wherein the first intermediate signal is obtained at the output terminal of the first flip-flop.

3. The digital glitch filter of claim 1, wherein the first intermediate signal is obtained at the inverted output terminal of the first flip-flop.

4. The digital glitch filter of claim 1, wherein the second intermediate signal is obtained at the output terminal of the second flip-flop.

5. The digital glitch filter of claim 1, wherein the second intermediate signal is obtained at the inverted output terminal of the second flip-flop.

6. The digital glitch filter of claim 1, wherein the first, second, third, and fourth flip-flops receive an externally generated input clock signal such that the frequency of the input clock signal provided to the fourth flip-flop is a predetermined multiple of the frequency of the input clock signal provided to the first, second, and third flip-flops.

7. The digital glitch filter of claim 6, wherein the filtered output signal is synchronized with the input clock signal.

8. The digital glitch filter of claim 1, wherein the first logic gates comprises an AND gate.

9. The digital glitch filter of claim 1, wherein the second logic gate comprises an OR gate.

10. The digital glitch filter of claim 1, wherein the first, second, third, and fourth flip-flops are D-type flip-flops.

11. A digital glitch filter for filtering an input signal, comprising:
   a first latch for generating a first intermediate signal based on detection of a negative glitch in the input signal, wherein the input signal is provided to at least one of a set terminal and a reset terminal of the first latch;
   a second latch for generating a second intermediate signal based on detection of a positive glitch in the input signal, wherein an inverted input signal is provided to at least one of a set terminal and a reset terminal of the second latch;
   a synchronizer, connected to the first and second latches, for generating a filtered output signal based on the first and second intermediate signals, wherein the synchronizer includes,
      an AND gate connected to an inverted output terminal of the first latch;
      an OR gate connected to an output terminal of the second latch and an output terminal of the AND gate;
      a first flip-flop, having a data input terminal connected to an output terminal of the OR gate and an output terminal connected to an input terminal of the AND gate, for generating a third intermediate signal based on the first and second intermediate signals; and
      a second flip-flop, having a data input terminal connected to the output terminal of the first flip-flop, for generating the filtered output signal based on the third intermediate signal.

12. The digital glitch filter of claim 11, wherein the first intermediate signal is obtained at an inverted output terminal of the first latch.

13. The digital glitch filter of claim 11, wherein the second intermediate signal is obtained at an output terminal of the second latch.

14. The digital glitch filter of claim 11, wherein an externally generated input clock signal is provided to at least one of the set terminal and the reset terminal of the first and second latches.

15. The digital glitch filter of claim 14, wherein the first and second flip-flops receive the externally generated input clock signal such that the frequency of the input clock signal provided to the second flip-flop is a predetermined multiple of the frequency of the input clock signal provided to the first flip-flop, and the first and second latches.

16. The digital glitch filter of claim 15, wherein the digital glitch filter eliminates glitches having a duration less than a predetermined number of cycles of the input clock signal.

17. The digital glitch filter of claim 15, wherein the filtered output signal is synchronized with the input clock signal.

18. The digital glitch filter of claim 11, wherein the first and second flip-flops are D-type flip-flops.

19. The digital glitch filter of claim 11, wherein the first and second latches are S-R latches.

* * * * *